(12) United States Patent
Bhushan et al.

(10) Patent No.: US 11,177,269 B2
(45) Date of Patent: Nov. 16, 2021

(54) MEMORY ARRAYS AND METHODS USED IN FORMING A MEMORY ARRAY

(71) Applicant: Micron Technology, Inc., Boise, ID (US)

(72) Inventors: Bharat Bhushan, Singapore (SG); Chris M. Carlson, Nampa, ID (US); Collin Howder, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/277,311

(22) Filed: Feb. 15, 2019

(65) Prior Publication Data
US 2020/0266203 A1 Aug. 20, 2020

(51) Int. Cl.
*H01L 27/11556* (2017.01)
*G11C 8/14* (2006.01)
(Continued)

(52) U.S. Cl.
CPC ...... *H01L 27/11556* (2013.01); *G06F 3/0688* (2013.01); *G11C 8/14* (2013.01);
(Continued)

(58) Field of Classification Search
CPC .... H01L 27/11; H01L 27/115; H01L 27/1152; H01L 27/1155; H01L 27/11524;
(Continued)

(56) References Cited

U.S. PATENT DOCUMENTS 9,431,419 B2 8/2016 Fukuzumi et al.
9,741,737 B1 8/2017 Huang et al.
(Continued)

FOREIGN PATENT DOCUMENTS

CN 102760738 10/2012
KR 10-2016-0018921 2/2016
(Continued)

OTHER PUBLICATIONS

U.S. Appl. No. 15/930,222, filed May 12, 2020, by Hopkins.
(Continued)

*Primary Examiner* — Monica D Harrison
(74) *Attorney, Agent, or Firm* — Wells St. John P.S.

(57) ABSTRACT

A method used in forming a memory array comprising strings of memory cells comprises forming a stack comprising vertically-alternating insulative tiers and wordline tiers. First charge-blocking material is formed to extend elevationally along the vertically-alternating tiers. The first charge-blocking material has k of at least 7.0 and comprises a metal oxide. A second charge-blocking material is formed laterally inward of the first charge-blocking material. The second charge-blocking material has k less than 7.0. Storage material is formed laterally inward of the second charge-blocking material. Insulative charge-passage material is formed laterally inward of the storage material. Channel material is formed to extend elevationally along the insulative tiers and the wordline tiers laterally inward of the insulative charge-passage material. Structure embodiments are disclosed.

23 Claims, 13 Drawing Sheets

(51) Int. Cl.
*G11C 16/04* (2006.01)
*G06F 3/06* (2006.01)
*H01L 27/11582* (2017.01)
*H01L 27/11529* (2017.01)
*H01L 27/11558* (2017.01)
*H01L 27/1157* (2017.01)
*H01L 27/11573* (2017.01)
*H01L 27/11524* (2017.01)

(52) U.S. Cl.
CPC ...... *G11C 16/0466* (2013.01); *H01L 27/1157* (2013.01); *H01L 27/11524* (2013.01); *H01L 27/11529* (2013.01); *H01L 27/11558* (2013.01); *H01L 27/11573* (2013.01); *H01L 27/11582* (2013.01)

(58) Field of Classification Search
CPC ......... H01L 27/11529; H01L 27/11556; H01L 27/11558; H01L 27/1157; H01L 27/11573; H01L 27/11582; G11C 8/14; G11C 16/04; G11C 16/046; G11C 16/0466; G06F 3/0688
USPC ....................................................... 257/314
See application file for complete search history.

(56) References Cited

U.S. PATENT DOCUMENTS

| | | | |
|---|---|---|---|
| 9,978,772 B1 | 5/2018 | Carlson | |
| 2009/0166710 A1* | 7/2009 | Shimizu | H01L 29/517 257/321 |
| 2010/0109072 A1 | 5/2010 | Kidoh et al. | |
| 2011/0147824 A1 | 6/2011 | Son et al. | |
| 2011/0298013 A1 | 12/2011 | Hwang et al. | |
| 2011/0303971 A1 | 12/2011 | Lee et al. | |
| 2012/0156848 A1 | 6/2012 | Yang et al. | |
| 2012/0273865 A1 | 11/2012 | Lee et al. | |
| 2015/0017770 A1 | 1/2015 | Lee et al. | |
| 2016/0043100 A1 | 2/2016 | Lee et al. | |
| 2016/0111435 A1 | 4/2016 | Pang et al. | |
| 2016/0163389 A1 | 6/2016 | Zhang et al. | |
| 2016/0163729 A1 | 6/2016 | Zhang et al. | |
| 2016/0172370 A1 | 6/2016 | Makala et al. | |
| 2016/0225754 A1 | 8/2016 | Jang | |
| 2016/0233230 A1* | 8/2016 | Furuhashi | H01L 27/11582 |
| 2017/0054036 A1* | 2/2017 | Dorhout | H01L 29/66666 |
| 2017/0236896 A1* | 8/2017 | Lu | H01L 27/11582 257/314 |
| 2017/0309339 A1 | 10/2017 | Hsiung et al. | |
| 2018/0114794 A1 | 4/2018 | Jang et al. | |
| 2018/0204849 A1 | 7/2018 | Carlson et al. | |
| 2018/0254285 A1 | 9/2018 | Lee et al. | |
| 2018/0294273 A1 | 10/2018 | Liao et al. | |

FOREIGN PATENT DOCUMENTS

| | | |
|---|---|---|
| KR | 10-2016-0094186 | 8/2016 |
| KR | 10-2017-0093099 | 8/2017 |
| KR | 10-2018-0045975 | 5/2018 |
| TW | 201901933 | 1/2019 |
| TW | 109104468 | 12/2020 |
| WO | WO 2016/093947 | 6/2016 |
| WO | PCT/US2020/015426 | 5/2020 |

OTHER PUBLICATIONS

U.S. Appl. No. 15/930,724, filed May 13, 2020, by Hopkins.
U.S. Appl. No. 15/930,836, filed May 13, 2020, by Hopkins et al.
U.S. Appl. No. 15/931,116, filed May 13, 2020, by Hopkins et al.
U.S. Appl. No. 15/931,299, filed May 13, 2020, by Hopkins et al.
U.S. Appl. No. 15/890,503, filed Feb. 7, 2018, by Howder et al.
U.S. Appl. No. 16/194,926, filed Nov. 19, 2018, by Chandolu et al.
U.S. Appl. No. 16/194,946, filed Nov. 19, 2018, by Clampitt et al.
U.S. Appl. No. 16/251,241, filed Jan. 18, 2019, by Howder et al.
U.S. Appl. No. 16/807,388, filed Mar. 3, 2020, by Hopkins.
U.S. Appl. No. 16/807,523, filed Mar. 3, 2020, by Hopkins.
U.S. Appl. No. 16/807,573, filed Mar. 3, 2020, by Hopkins et al.
U.S. Appl. No. 16/894,519, filed Jun. 5, 2020, by Hopkins et al.
Shie, "The Interface Investigation of High-K Material Al2O3 on Si Substrate", A Thesis Submitted to the Institute of Electronics, College of Electrical Engineering and Computer Science, National Chiao Tung University, 2004, Taiwan, 63 pgs.

* cited by examiner

US 11,177,269 B2

MEMORY ARRAYS AND METHODS USED IN FORMING A MEMORY ARRAY

TECHNICAL FIELD

Embodiments disclosed herein pertain to memory arrays and to methods used in forming a memory array.

BACKGROUND

Memory is one type of integrated circuitry and is used in computer systems for storing data. Memory may be fabricated in one or more arrays of individual memory cells. Memory cells may be written to, or read from, using digit lines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

DETAILED DESCRIPTION OF EXAMPLE EMBODIMENTS

Embodiments of the invention encompass methods used in forming an array of transistors and/or memory comprising strings of memory cells, for example an array of NAND or other memory cells having peripheral control circuitry under the array (e.g., CMOS under-array). Embodiments of the invention encompass so-called "gate-last" or "replacement-gate" processing, so-called "gate-first" processing, and other processing whether existing or future-developed independent of when transistor gates are formed. Embodiments of the invention also encompass an array of transistors and/or memory cells (e.g., NAND or other memory cells) independent of method of manufacture. First example method embodiments are described with reference to FIGS. 1-28 which may be considered as a "gate-last" or "replacement-gate" process.

Figure 1:
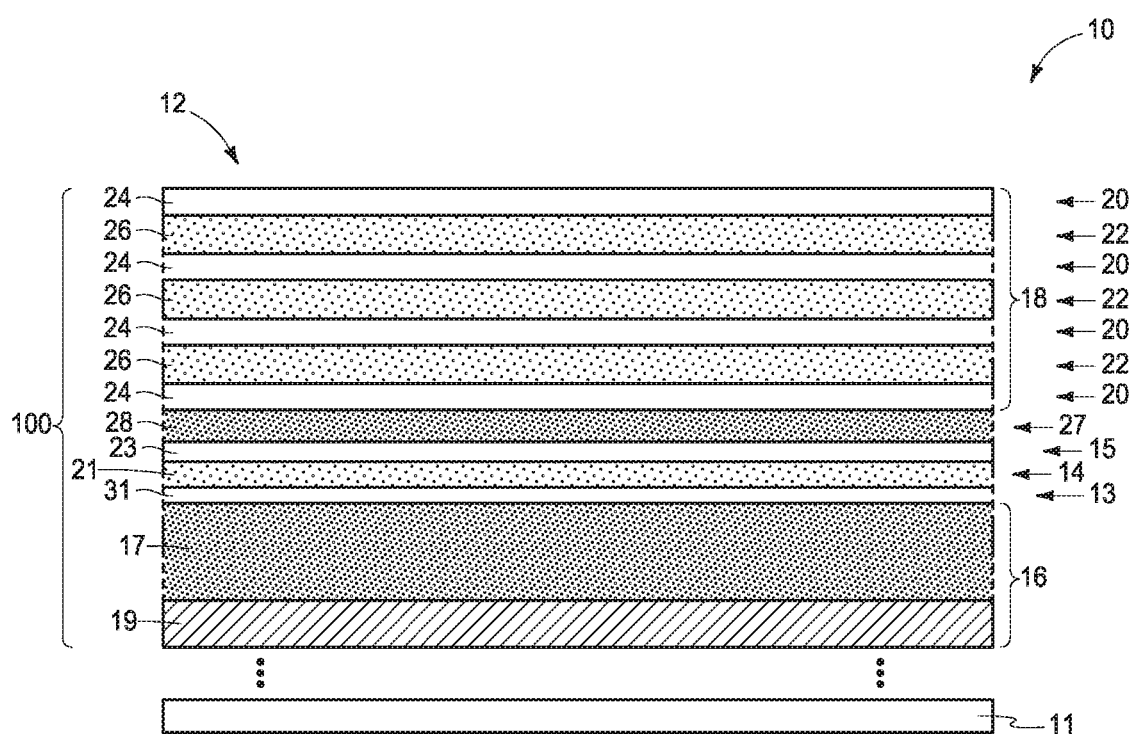
FIG. 1 is a diagrammatic cross-sectional view of a portion of a substrate in process in accordance with an embodiment of the invention.

FIG. 1 shows a construction 10 in a method of forming an array 12 of elevationally-extending strings of transistors and/or memory cells (not yet shown). Construction 10 comprises a base substrate 11 having any one or more of conductive/conductor/conducting, semiconductive/semi-conductor/semiconducting, or insulative/insulator/insulating (i.e., electrically herein) materials. Various materials have been formed elevationally over base substrate 11. Materials may be aside, elevationally inward, or elevationally outward of the FIG. 1—depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

Substrate/construction 10 comprises a conductive tier 16. Example conductive tier 16 is shown as comprising a conductive material 17 (e.g., conductively-doped semiconductive material such as conductively-doped polysilicon) above a conductive material 19 (e.g., metal material such as $WSi_x$). Conductive tier 16 may comprise part of control circuitry (e.g., peripheral-under-array circuitry) used to control read and write access to the transistors and/or memory cells that will be formed within array 12.

Construction 10 comprises a first insulator tier 13 above conductive tier 16, a sacrificial material tier 14 above first insulator tier 13, and a second insulator tier 15 above sacrificial material tier 14. In some embodiments, first insulator tier 13 comprises an insulative metal oxide 31 and second insulator tier 15, when present, comprises insulative metal oxide 23 which may be of the same or different composition as that of insulative metal oxide 31. In the context of this document, "metal" of an "insulative metal oxide" is any elemental metal including any of the elemental semimetals (i.e., B, Si, Ge, As, Sb, Te, Po, and At). Some examples include $SiO_2$, $Al_2O_3$, $HfO_2$, $ZrO_2$, silicates, aluminates, $Hf_xZr_yO_z$, and $Si_xAl_yO_z$. In one embodiment, the insulative metal oxide comprises multiple elemental metals and in one such embodiment where one of the elemental metals is Si. In one embodiment, at least a majority of the insulative metal oxide is stoichiometric, and in another embodiment at least a majority of the insulative metal oxide is non-stoichiometric. Regardless, the insulative metal oxide may contain a conductive metal oxide species (e.g., $RuO_2$, $IrO_2$, etc.) but nevertheless be overall insulative when considered as a whole (i.e., it has overall compositional intrinsic electrical conductivity of no greater than $1 \times 10^{-10}$ siemen/cm at 20° C.). Sacrificial material tier 14 comprises sacrificial material 21 that may be etched selectively relative to material 31 of first insulator tier 13 and selectively relative to material 23 of second insulator tier 15. One ideal example is silicon nitride, although any other suitable material may be used, including metal material. A conductively-doped semiconductive material tier 27 is above sacrificial material tier 14 and comprises conductively-doped semiconductive material 28 (e.g., conductively-doped polysilicon).

Substrate construction 10 comprises a stack 18 above second insulator tier 15 (and conductively-doped semiconductive material tier 27 when present). Stack 18 comprises vertically-alternating insulative tiers 20 and wordline tiers 22, with conductively-doped semiconductive material tier 27 when present being vertically between second insulator tier 15 and a lowest of insulative tiers 20. Only a small number of tiers 20 and 22 is shown, with more likely stack 18 comprising dozens, a hundred or more, etc. of tiers 20 and 22. Other circuitry that may or may not be part of peripheral and/or control circuitry may be between conductive tier 16 and stack 18. For example, multiple vertically-alternating tiers of conductive material and insulative material of such circuitry may be below a lowest of the wordline tiers 22 and/or above an uppermost of the wordline tiers 22. Regardless, wordline tiers 22 may not comprise conductive material and insulative tiers 20 may not comprise insulative material or be insulative at this point in processing. Example wordline tiers 22 comprise first material 26 (e.g., silicon nitride) which may be wholly or partially sacrificial. Example insulative tiers 20 comprise second material 24 (e.g., silicon dioxide) that is of different composition from that of first material 26 and which may be wholly or partially sacrificial. Collectively, stack 18 and tiers 16, 13, 14, 15, and 27 may be considered as a stack 100. Only one stack 18 and one stack 100 are shown, although more than one stack 18 and/or one stack 100 may be above or below (not shown) stack 18 and/or stack 100 above or below substrate 11. Further, one or more of tiers 16, 13, 14, 15, and 27 may not be present.

Figure 2:
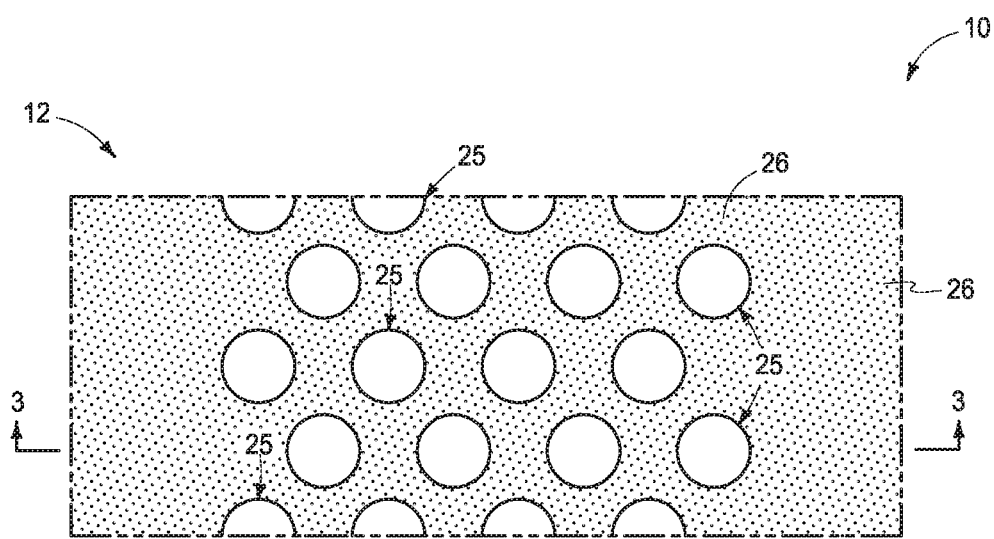
FIGS. 2-28 are diagrammatic sequential sectional and/or enlarged views of the construction of FIG. 1 in process in accordance with some embodiments of the invention.
Figure 3:
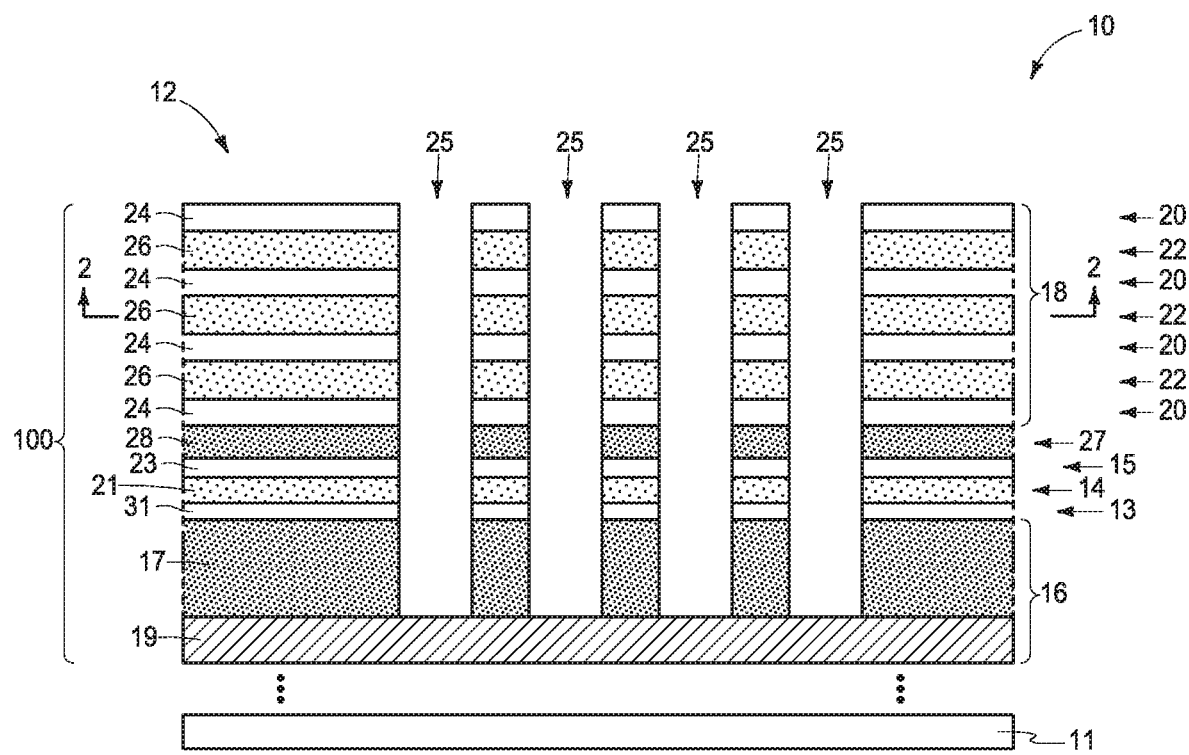

Referring to FIGS. 2 and 3, channel openings 25 have been formed (e.g., by dry anisotropic etching) into alternating tiers 20 and 22. By way of example only, channel openings 25 are shown as being arranged in groups or columns of staggered rows of four openings 25 per row. Any alternate existing or future-developed arrangement and construction may be used. Example channel openings 25 are shown as going into conductive tier 16 and in one embodiment as shown as going through material 17 and stopping on material 19.

Transistor channel material is formed in the individual channel openings to extend elevationally through the insulative tiers and the wordline tiers, and individual memory cells of the array may be formed to comprise a gate region (e.g., a control-gate region) and a memory structure laterally (e.g., radially) between the gate region and the channel material. The memory structure is formed to comprise charge-blocking material, storage material (e.g., charge-storage material), and insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a bandgap-engineered structure having nitrogen containing material [e.g., silicon nitride] sandwiched between two insulator oxides [e.g., silicon dioxide]) is laterally between the channel material and the storage material.

Figure 4:
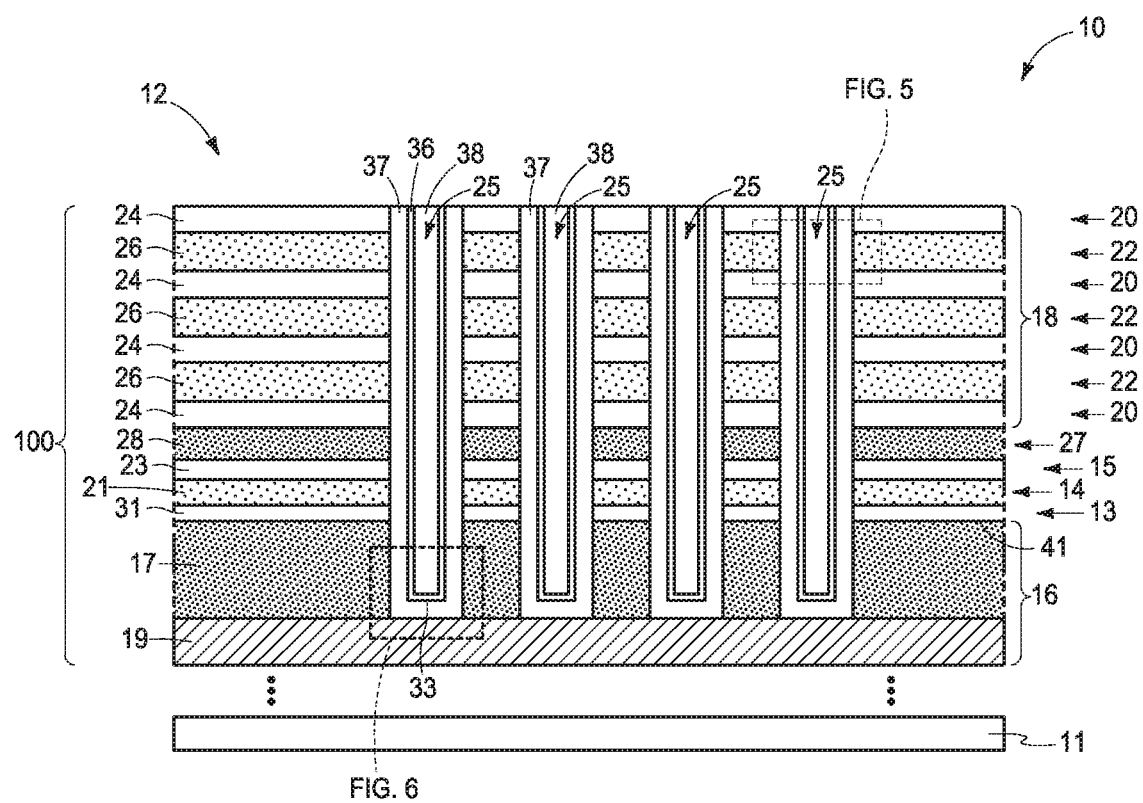
Figure 5:
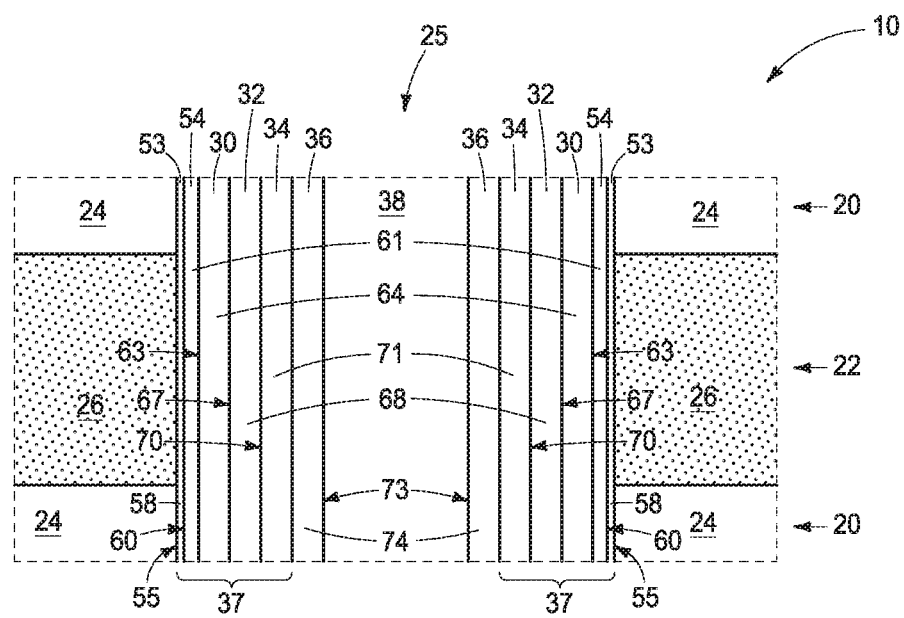
Figure 6:
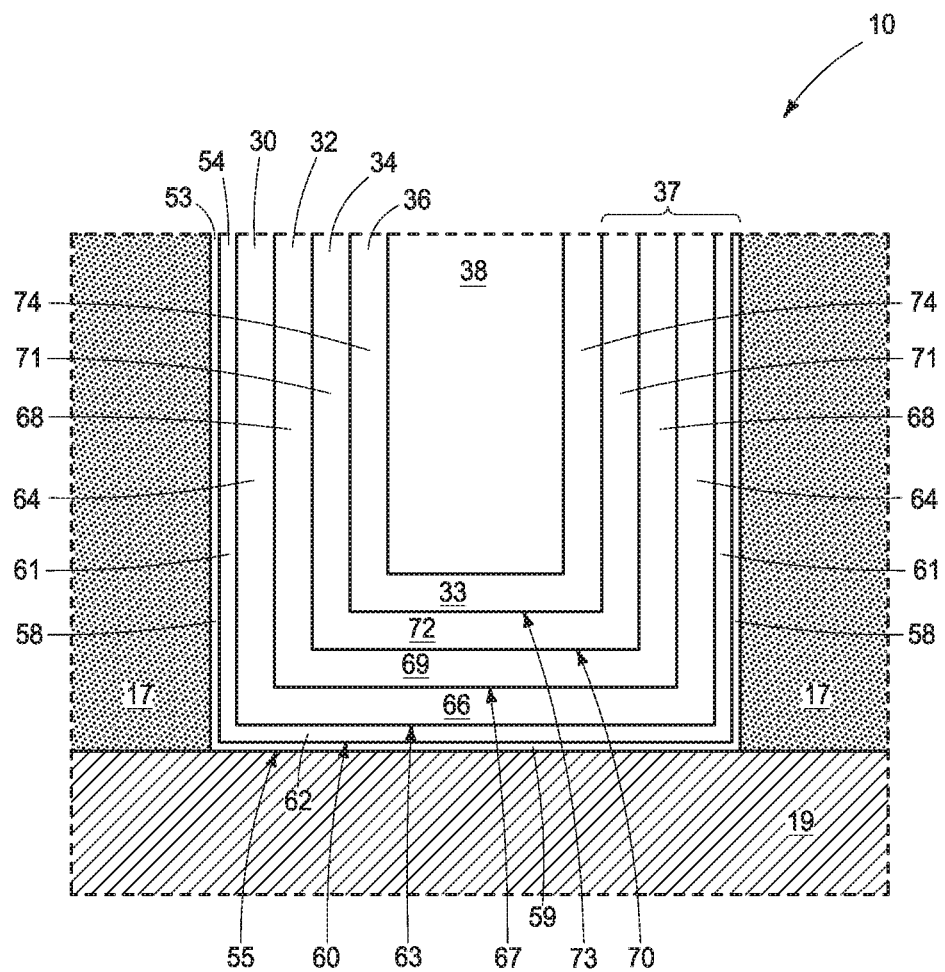

Referring to FIGS. 4-6 and in one embodiment, insulator material 53 has been formed within channel openings 25 to extend elevationally along vertically-alternating tiers 20 and 22. In one embodiment, insulator material 53 is formed by atomic layer deposition and to be directly against insulating material 24 and, in one such embodiment, insulating material 24 and insulator material 53 are of the same composition relative one another (e.g., $SiO_2$). In one embodiment, insulator material 53 is formed as a lining 55 within channel opening 25 and having sidewalls 58 that are interconnected by a bottom 59 extending laterally there-between.

A first charge-blocking material 54 has been formed within channel openings 25 to extend elevationally along vertically-alternating tiers 20 and 22 laterally inward of insulator material 53. First charge-blocking material 54 has a dielectric constant k of at least 7.0 and comprises a metal oxide. In one embodiment, first charge-blocking material 54 has k of at least 8.0 and in one such embodiment of at least 9.0. First charge-blocking material 54 may or may not be stoichiometric. In one embodiment, first charge-blocking material 54 comprises an insulative metal oxide comprising at least one of Al, Hf, Zr, Ti, La, St, Ta, and Dy. In one embodiment, first charge-blocking material 54 comprises at least one of an aluminate and a silicate. In one embodiment, insulative metal oxide 54 comprises multiple elemental metals and in one embodiment comprises $Al_2O_3$. In one embodiment, first charge-blocking material 54 is formed as a lining 60 having sidewalls 61 that are interconnected by a bottom 62 extending laterally there-between, with bottom 62 being directly above bottom 59 of insulator material lining 55.

A second charge-blocking material 30 has been formed laterally inward of first charge-blocking material 54. Second charge-blocking material 30 has k less than 7.0. The second charge-blocking insulative metal oxide may contain a species having k of at least 7.0 but nevertheless have an overall k of less than 7.0 when considered as a whole (i.e., it has overall compositional intrinsic k of less than 7.0). In one embodiment, second charge-blocking material 30 has k of no more than 5.0 and in one such embodiment no more than 4.0. Second charge-blocking material 30 may or may not be stoichiometric and in one embodiment comprises $SiO_2$. In one embodiment, second charge-blocking material 30 is formed to extend elevationally along vertically-alternating tiers 20 and 22 and in one embodiment is formed to comprise a lining 63 having sidewalls 64 that are interconnected by a bottom 66 extending laterally there-between.

Storage material 32 has been formed laterally inward of second charge-blocking material 30. In one embodiment, storage material 32 extends elevationally along vertically-alternating tiers 20 and 22 and in one such embodiment comprises a lining 67 having sidewall 68 that are interconnected by a bottom 69 extending laterally there-between.

Insulative charge-passage material 34 has been formed laterally inward of storage material 32. In one embodiment, insulative charge-passage material 34 extends elevationally along vertically-alternating tiers 20 and 22 and in one such embodiment comprises a lining 70 within channel opening 25 having sidewall 71 that are interconnected by a bottom 72 extending laterally there-between. Collectively, materials 53, 54, 30, 32, and 34 are designated as material 37 for clarity in FIG. 4.

Channel material 36 has been formed to extend elevationally along insulative tiers 20 and wordline tiers 22 laterally inward of insulative charge-passage material 34. In one embodiment, channel material 36 is formed as a lining 73 having sidewalls 74 that are interconnected by a bottom 33 extending laterally there-between. Example channel materials 36 include appropriately-doped crystalline semiconductor material, such as one or more silicon, germanium, and so-called III/V semiconductor materials (e.g., GaAs, InP, GaP, and GaN).

Materials 53, 54, 30, 32, 34, and 36 may be formed by, for example, deposition of respective thin layers thereof over stack 18 and within individual channel openings 25 followed by planarizing such back at least to an uppermost surface of stack 18. Punch etching may be conducted (not shown) to remove one or more of materials 53, 54, 30, 32, 34, and 36 from the bases of channel openings 25 to expose (not shown) conductive tier 16. Example thicknesses for each of materials 53, 54, 30, 32, 34, and 36 are 25 to 100 Angstroms. Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown). Regardless, and in one embodiment as shown, channel material 36 has been formed into conductive tier 16 and its bottom 33 is nowhere directly against any conductive material in conductive tier 16.

Figure 7:
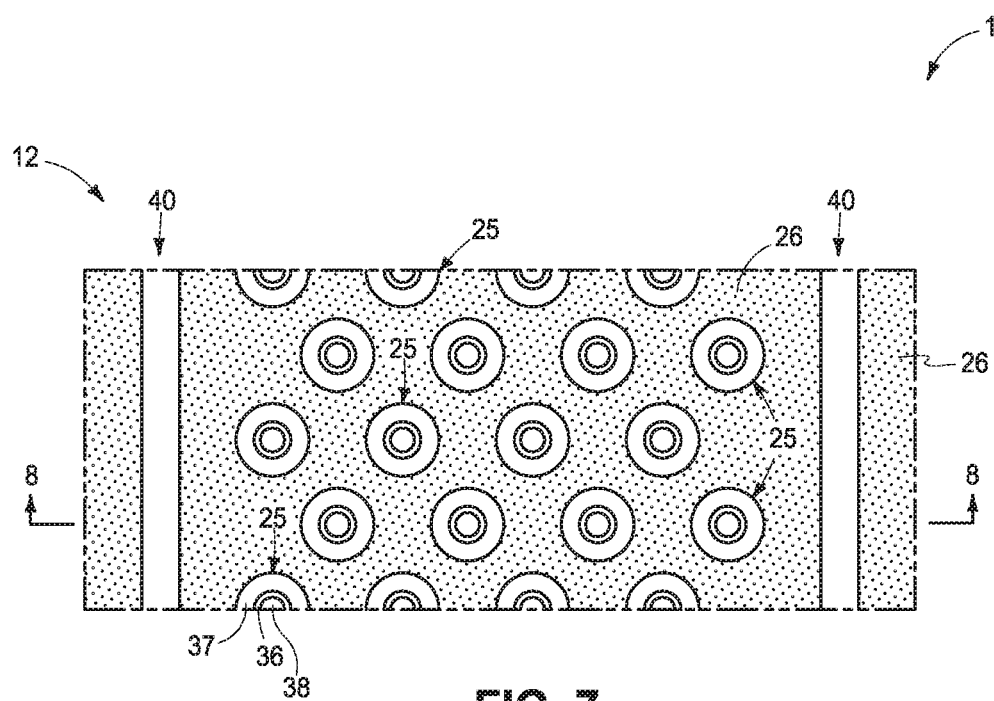
Figure 8:
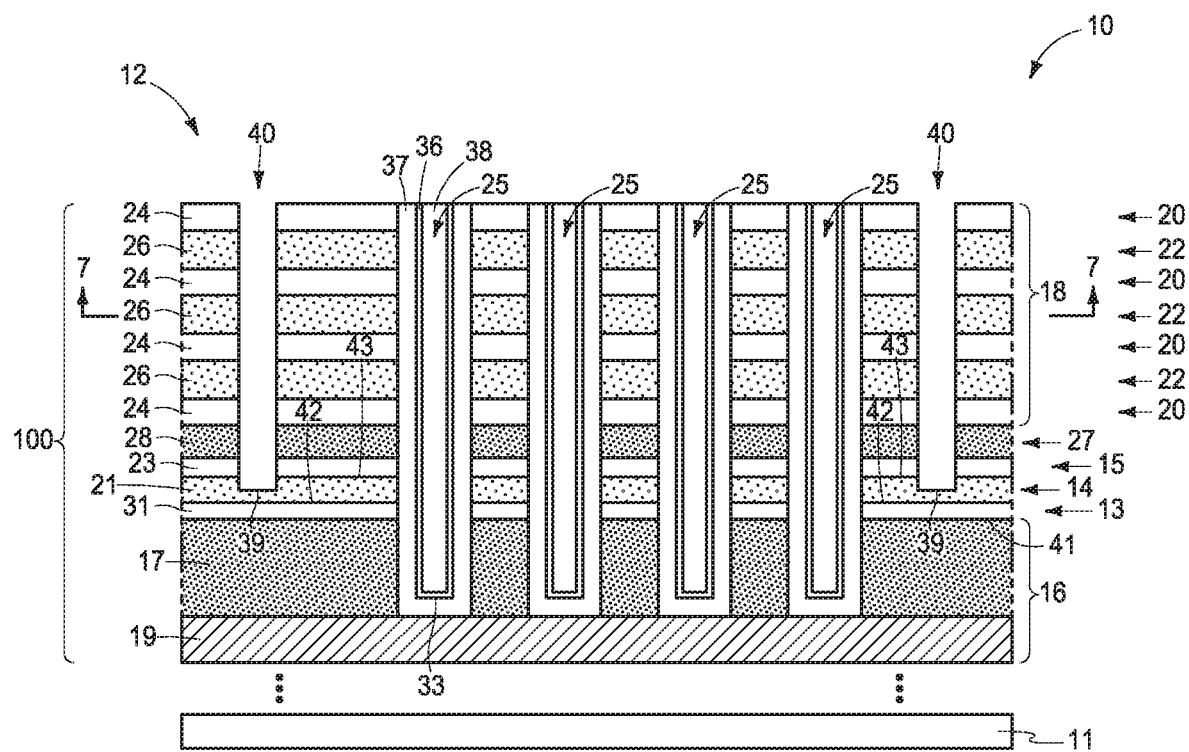

Referring to FIGS. 7 and 8, horizontally-elongated trenches 40 have been formed (e.g., by anisotropic etching) through stack 18 to sacrificial material tier 14. In one embodiment, horizontally-elongated trenches 40 have respective bottoms 39 that are above a bottom 41 of first insulator tier 13. In one such embodiment, bottoms 39 of horizontally-elongated trenches 40 are above a top 42 of first insulator tier 13 and, in one such latter embodiment, bottoms 39 of horizontally-elongated trenches 40 are below a top 43 of sacrificial material tier 14.

Figure 9:
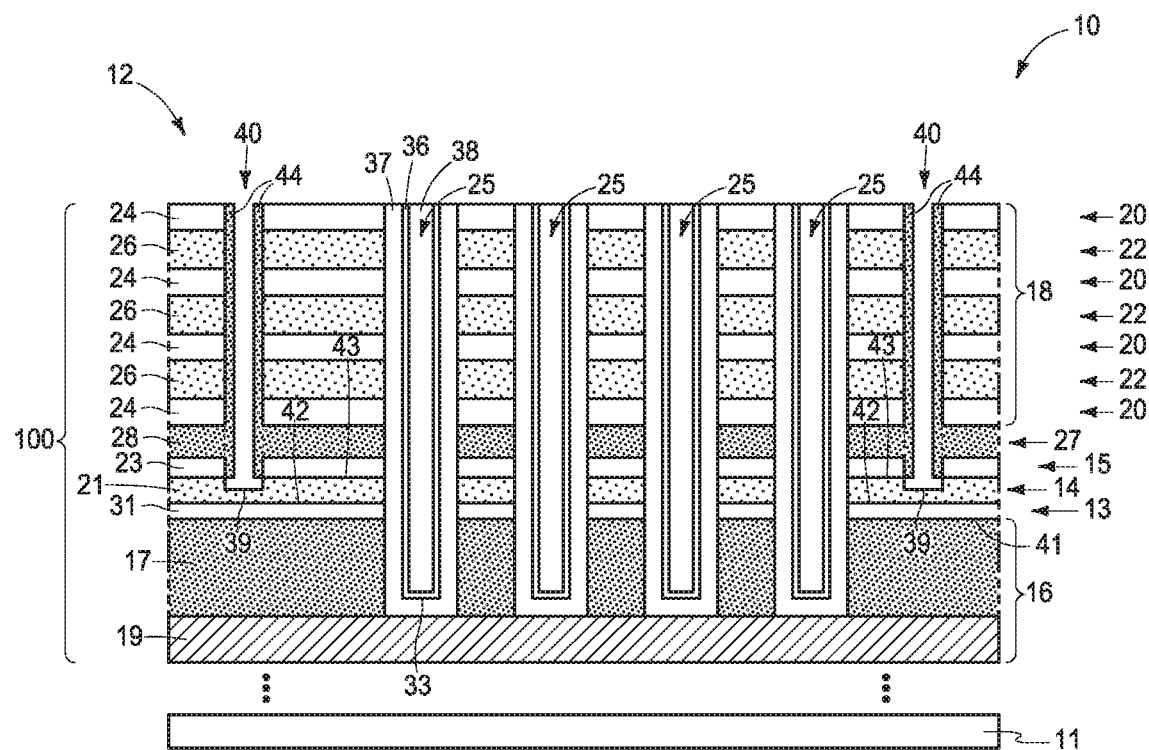

Referring to FIG. 9, and in one embodiment, a sacrificial sidewall liner 44 (e.g., doped or undoped polysilicon) has been formed in horizontally-elongated trenches 40. Such may be of the same composition as that of conductively-doped semiconductive material 28 of conductively-doped semiconductive material tier 27. Such a liner 44 may be provided, for example, wherein material 26 is sacrificial and comprises the same composition as that of sacrificial material 21 (e.g., silicon nitride). Such may be subjected to a punch-etch, for example as shown, to remove liner 44 from extending completely across bottoms 39 of trenches 40 to expose sacrificial material 21 of sacrificial material tier 14.

Figure 10:
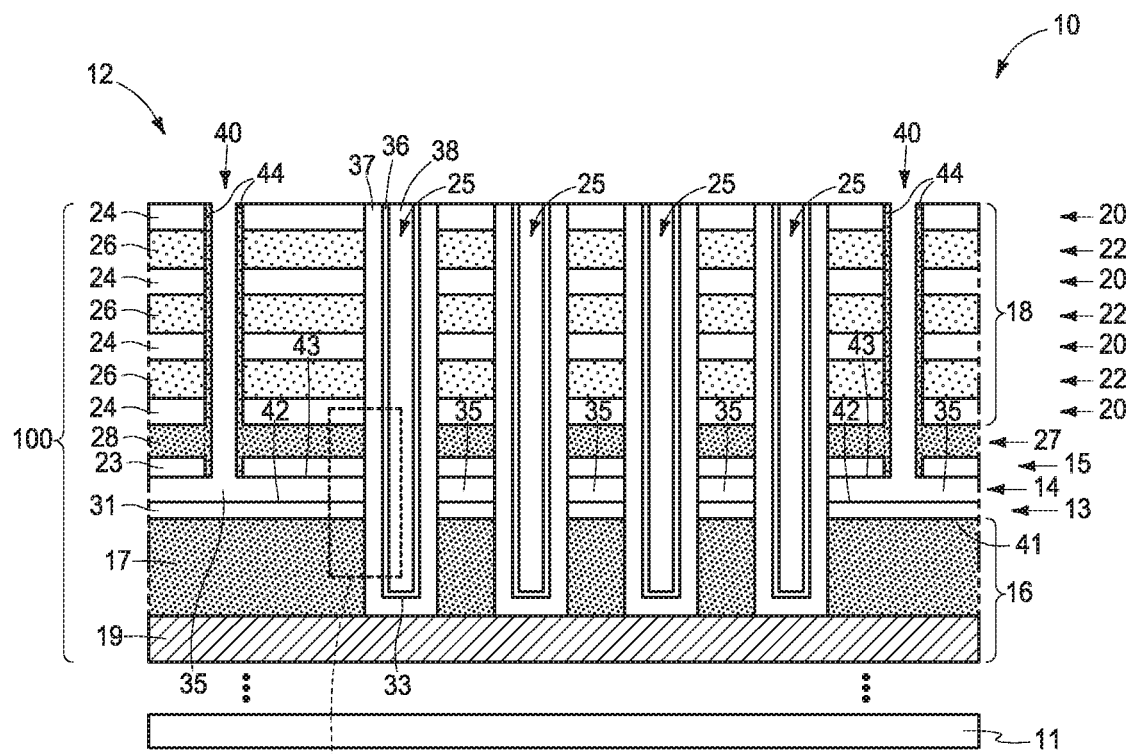
Figure 11:
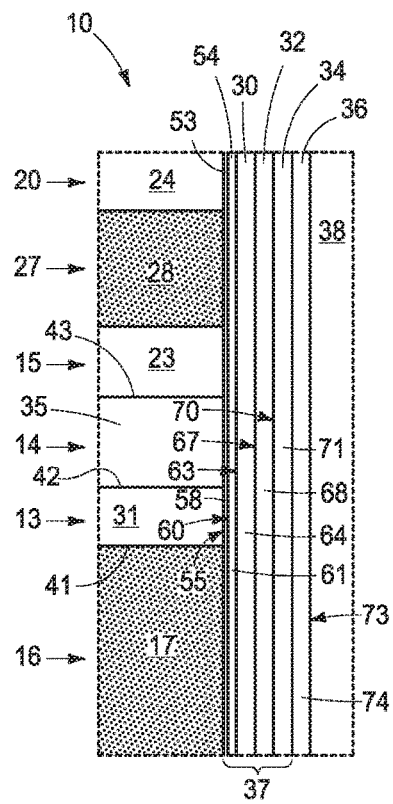

Referring to FIGS. 10 and 11 (FIG. 11 being an enlarged view of a portion of FIG. 10), sacrificial material 21 (not shown) has been etched (e.g., by wet etching, for example using $H_3PO_4$ where sacrificial material comprises silicon nitride) through horizontally-elongated trenches 40 selectively relative to material 31 of first insulator tier 13 and selectively relative to material 23 of second insulator tier 15. Such has formed a void space 35. Thickness of sacrificial sidewall liner 44, when present, may be reduced thereby, for example as shown.

Figure 12:
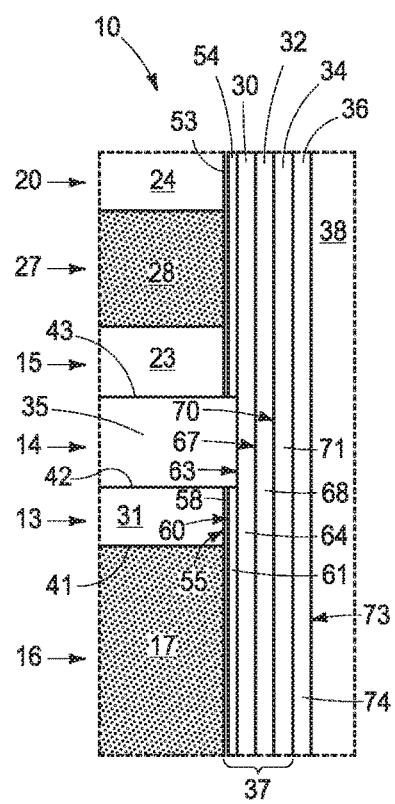

A laterally-outer sidewall of the channel in the sacrificial material tier is ultimately exposed, in one embodiment. Such is shown, by way of example only, with respect to enlarged FIGS. 12-15. Referring to FIG. 12, materials 53 and 54 in sacrificial material tier 14 have been etched to expose material 30 (e.g., using 100:1 [by volume] dilute HF where material 53 comprises silicon dioxide and using $H_3PO_4$ where material 54 comprises $Al_2O_3$). Such may etch material 53 and/or material 54 upwardly and downwardly (not shown) relative to sacrificial material tier 14.

Figure 13:
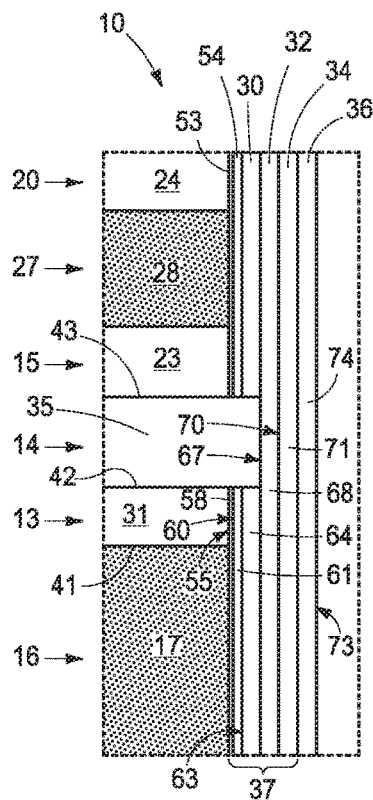

Referring to FIG. 13, material 30 in sacrificial material tier 14 has been etched to expose material 32 (e.g., using 100:1 [by volume] dilute HF where material 30 comprises silicon dioxide). Such may etch materials 53, 54, and/or 30 upwardly and downwardly (not shown) relative to sacrificial material tier 14.

Figure 14:
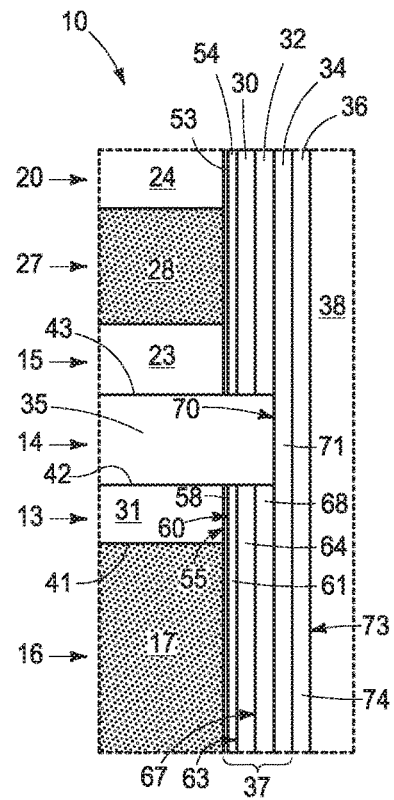

FIG. 14 shows etching of material 32 that is in sacrificial material tier 14 to expose material 34. Such may etch materials 53, 54, 30, and/or 32 upwardly and downwardly (not shown) relative to sacrificial material tier 14. Where, for example, material 32 comprises silicon nitride, such etching may occur by using $H_3PO_4$ or 1000:1 (by volume) ultra-dilute HF selectively relative to material 34 where at least a laterally-outermost portion thereof comprises silicon dioxide.

Figure 15:
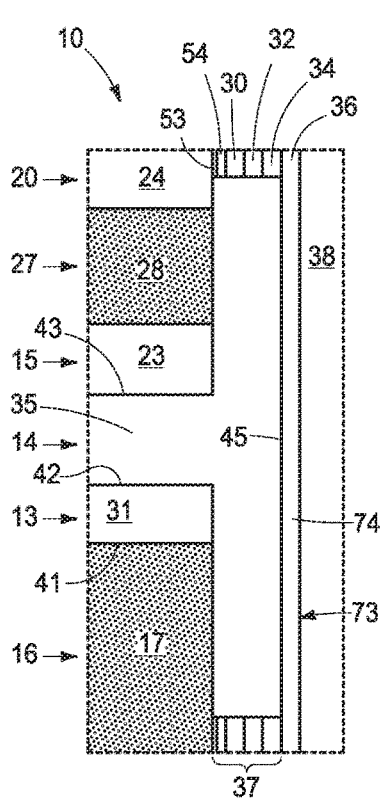

FIG. 15 shows example subsequent etching of exposed material 34 selectively relative to channel material 36, for example using 100:1 dilute HF if material 34 comprises silicon dioxide and/or also using, for example, $H_3PO_4$ if material 34 also comprises silicon nitride. Such has resulted in exposure of a laterally-outer sidewall 45 of channel material 36 in sacrificial material tier 14. Materials 53, 54, 30, 32 and/or 34 may be etched upwardly and downwardly as shown.

Figure 16:
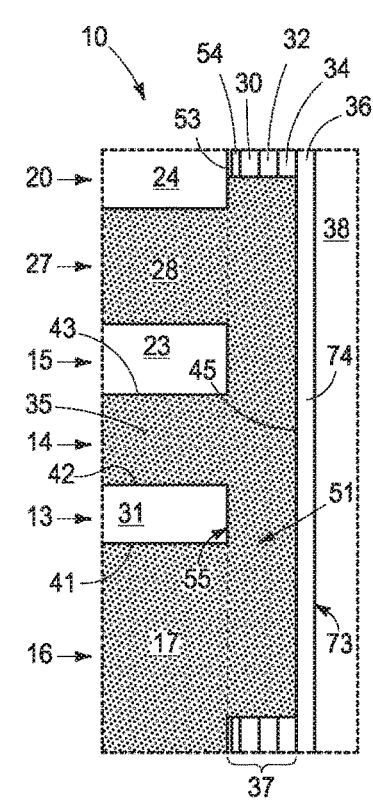
Figure 17:
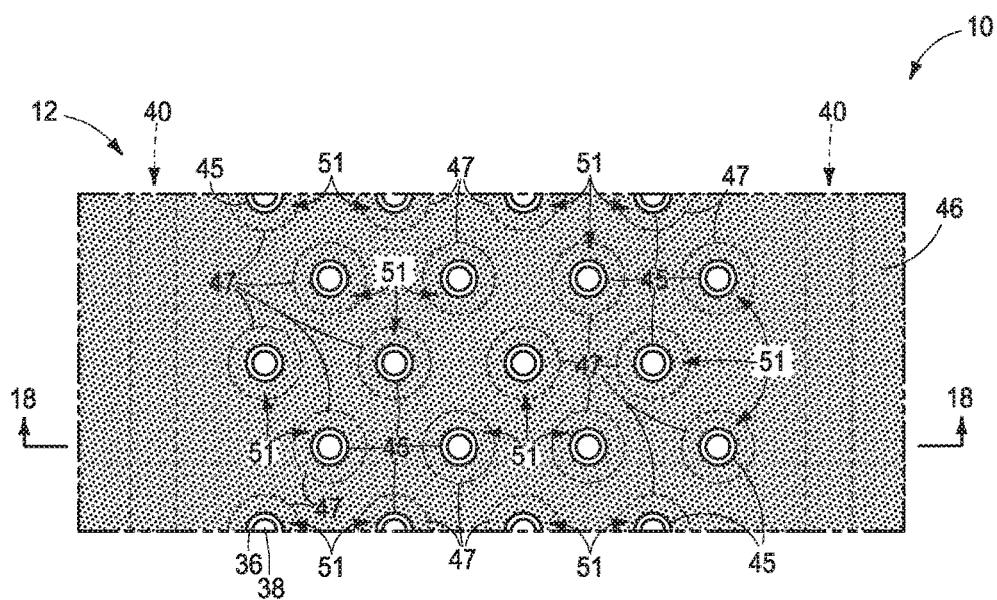
Figure 18:
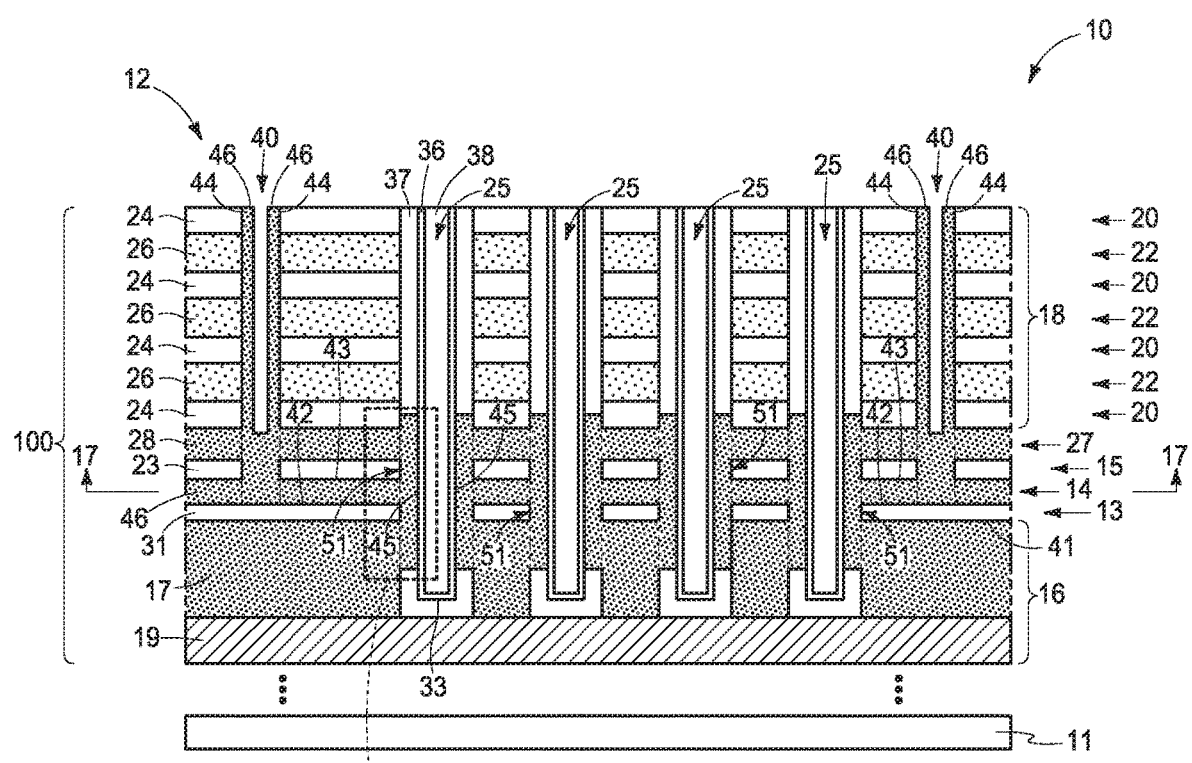

Referring to FIGS. 16-18 (FIG. 16 being an enlarged view of a portion of FIG. 18), conductive material 46 has been formed within trenches 40 and within sacrificial material tier 14, resulting in the formation of a conductive structure 51 that is directly against laterally-outer sidewall 45 of channel material 36 in sacrificial material tier 14 and directly electrically couples channel material 36 to conductive tier 16. In one embodiment, conductive structure 51 extends through first insulator tier 13. In one embodiment, conductive material 46 is of the same composition as one or both of materials 28 and 17 (e.g., conductively-doped semiconductive material such as conductively-doped polysilicon). Such may also, in one embodiment, be of the same composition as sacrificial sidewall liner 44 where such is present. Regardless, and in one embodiment as shown, conductive structure 51 comprises an annulus 47 (FIG. 17). Further and regardless, and in one embodiment as shown, conductive structure 51 may be in conductively-doped semiconductive material tier 27 laterally between (a) channel material 36 that is in conductively-doped semiconductive material tier 27 and (b) conductively-doped semiconductive material 28 of conductively-doped semiconductive material tier 27. In one embodiment, conductivity-increasing dopant that is in conductively-doped semiconductive material 28 is diffused laterally (e.g., by a dedicated anneal step or merely by inherent thermal processing in the process) through conductive structure 51 into channel material 36 and upwardly into channel material 36 that is above (and perhaps below) conductively-doped semiconductive material tier 27. In one such embodiment, conductive structure 51 comprises conductively-doped semiconductive material (e.g., 46) comprising the conductivity-increasing dopant before and after such diffusing action.

Figure 19:
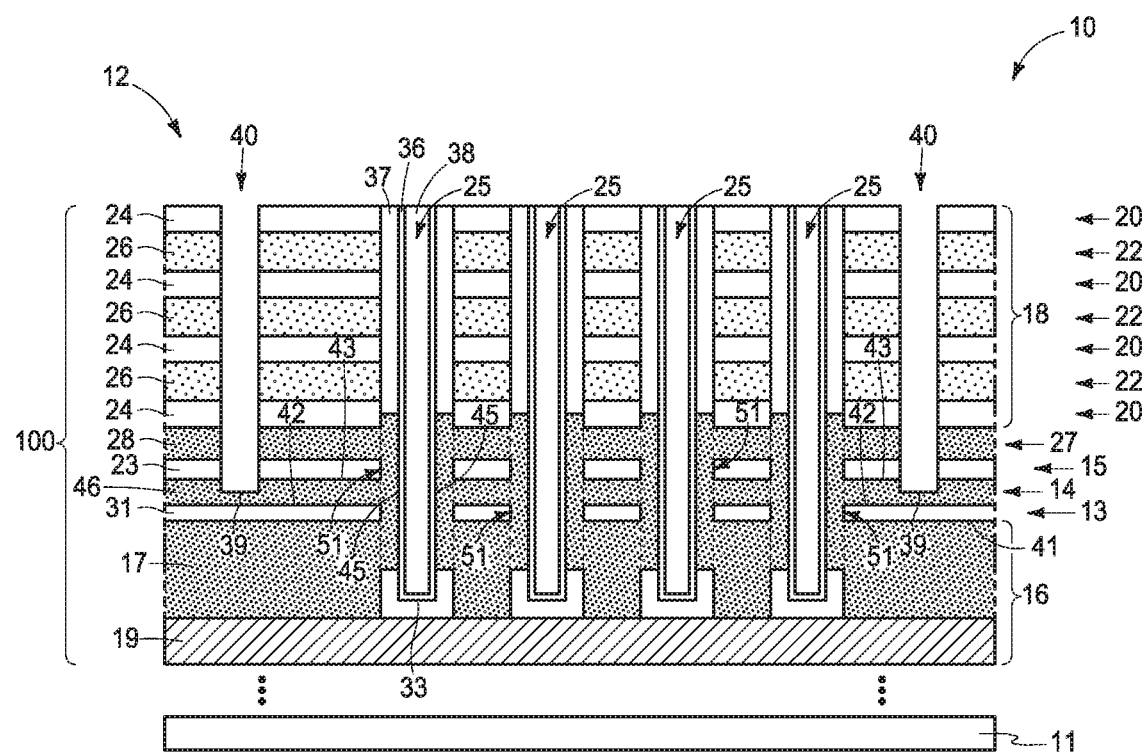

Referring to FIG. 19, conductive material 46 (not shown) and sacrificial sidewall liner 44 (not shown) when present have been removed through trenches 40 at least to below conductively-doped semiconductive material tier 27 (when present), for example as shown.

Figure 20:
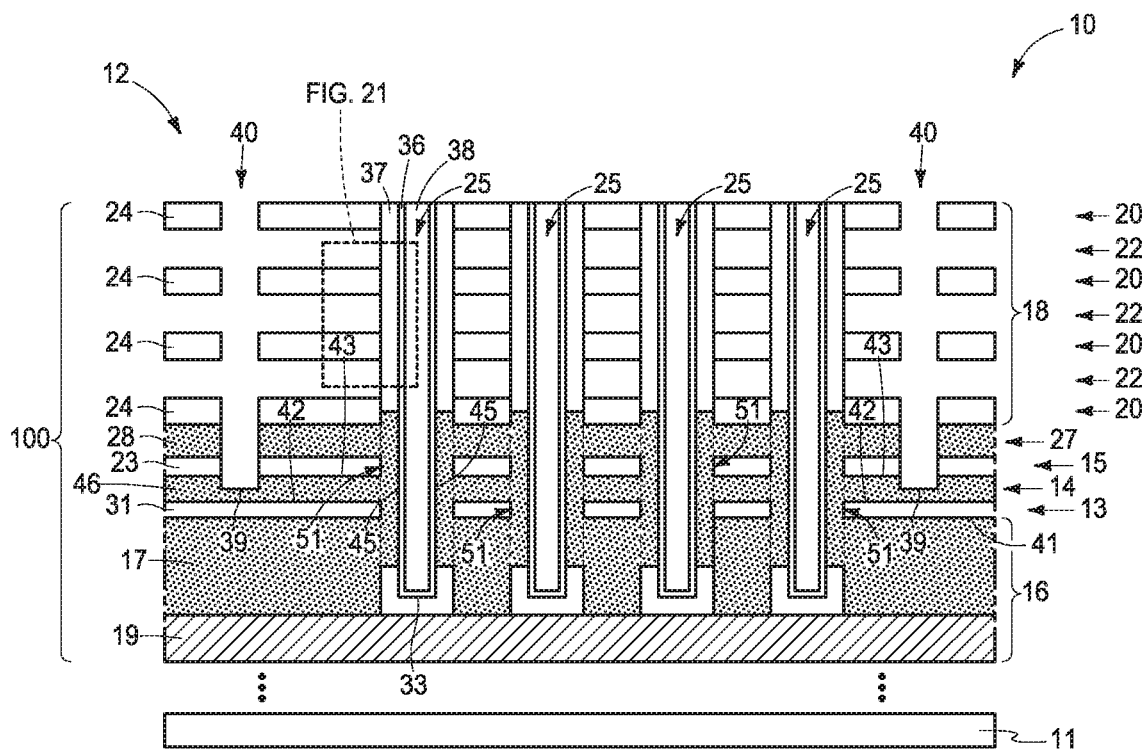
Figure 21:
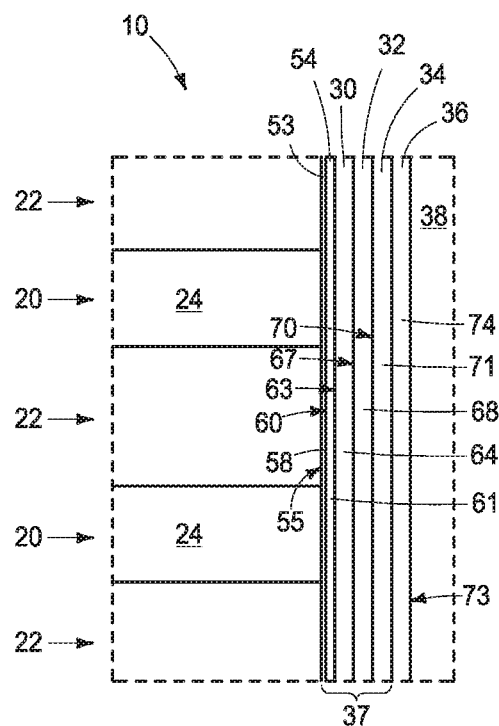

Referring to FIGS. 20 and 21, first material 26 (not shown) of wordline tiers 22 has been etched selectively relative to second material 24 and insulator material 53 (e.g., using liquid or vapor $H_3PO_4$ or 1000:1 [by volume] ultra-dilute HF as a primary etchant where material 26 is silicon nitride and materials 24 and 53 are silicon dioxide).

Figure 22:
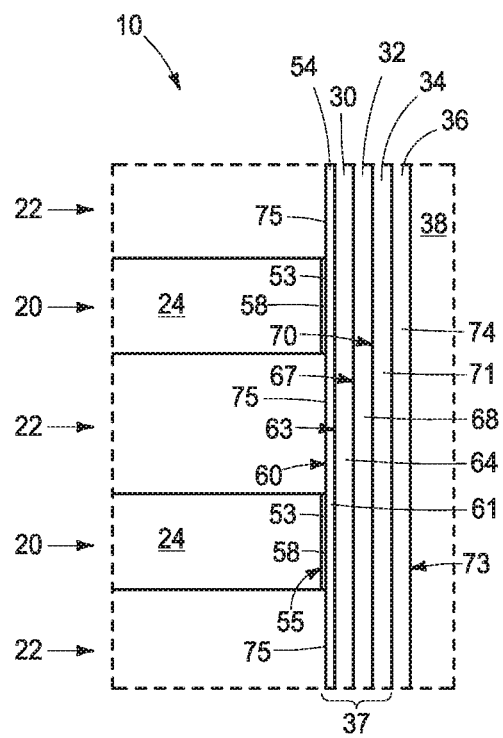

Referring to FIG. 22, insulator material 53 in wordline tiers 22 has been removed to expose a laterally outer sidewall 75 of the first charge-blocking material 54 (e.g., using 100:1 [by volume] dilute HF where material 53 comprises silicon dioxide).

Figure 23:
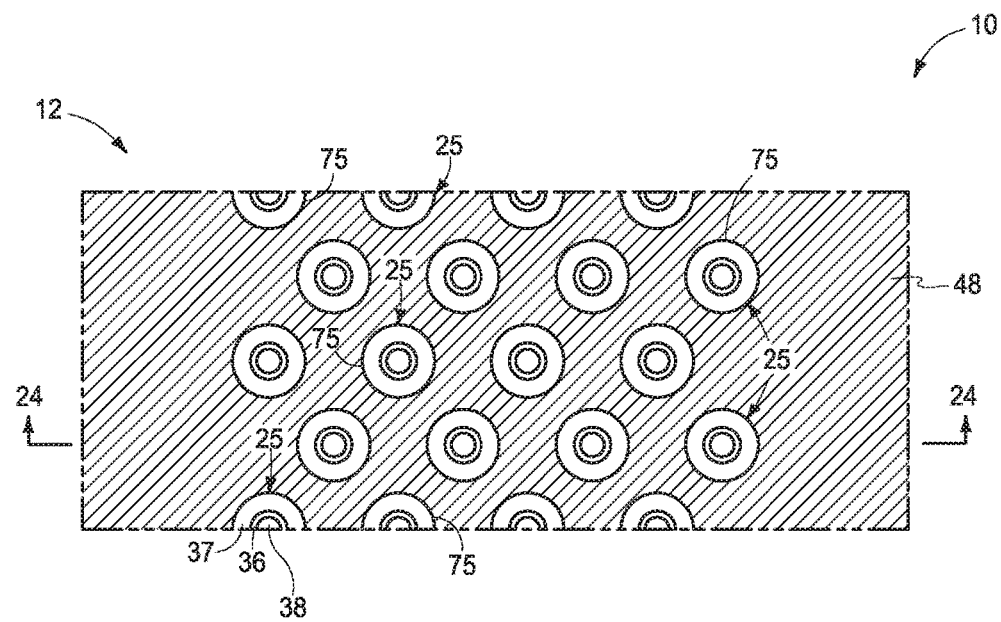
Figure 24:
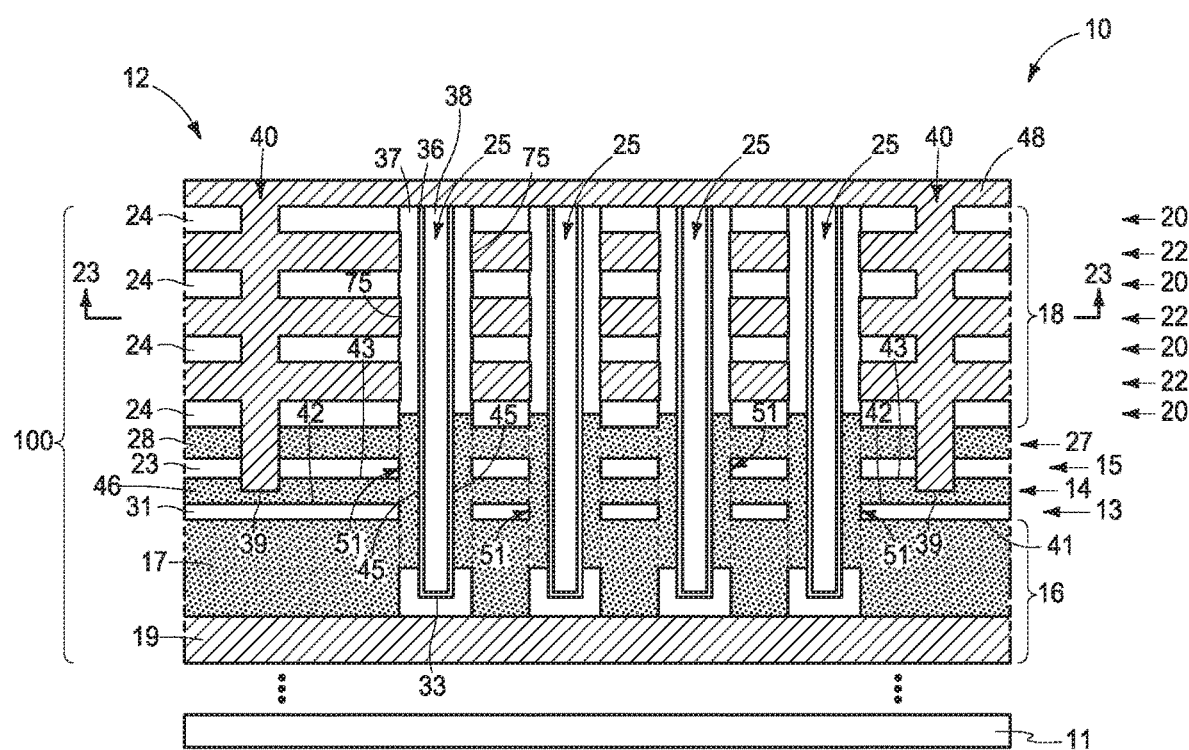

Referring to FIGS. 23 and 24, conductive material 48 has been formed into wordline tiers 22 through trenches 40 and directly against exposed laterally outer sidewalls 75 of first charge-blocking material 54. In but one example embodiment, conductive material 48 comprises a first-deposited conformal titanium nitride liner (not shown) followed by deposition of another composition metal material (e.g., elemental tungsten).

Figure 25:
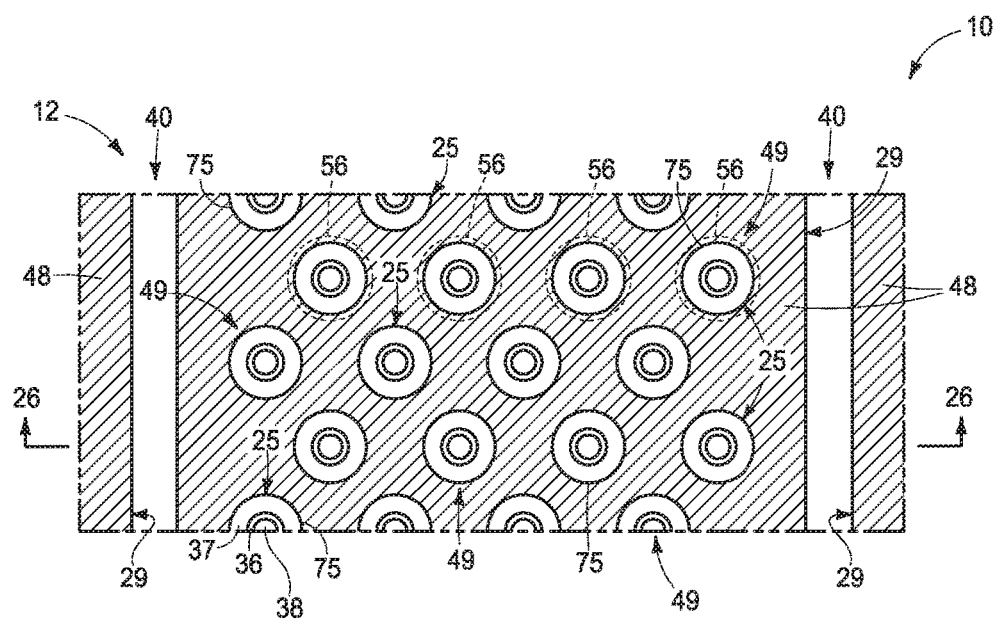
Figure 26:
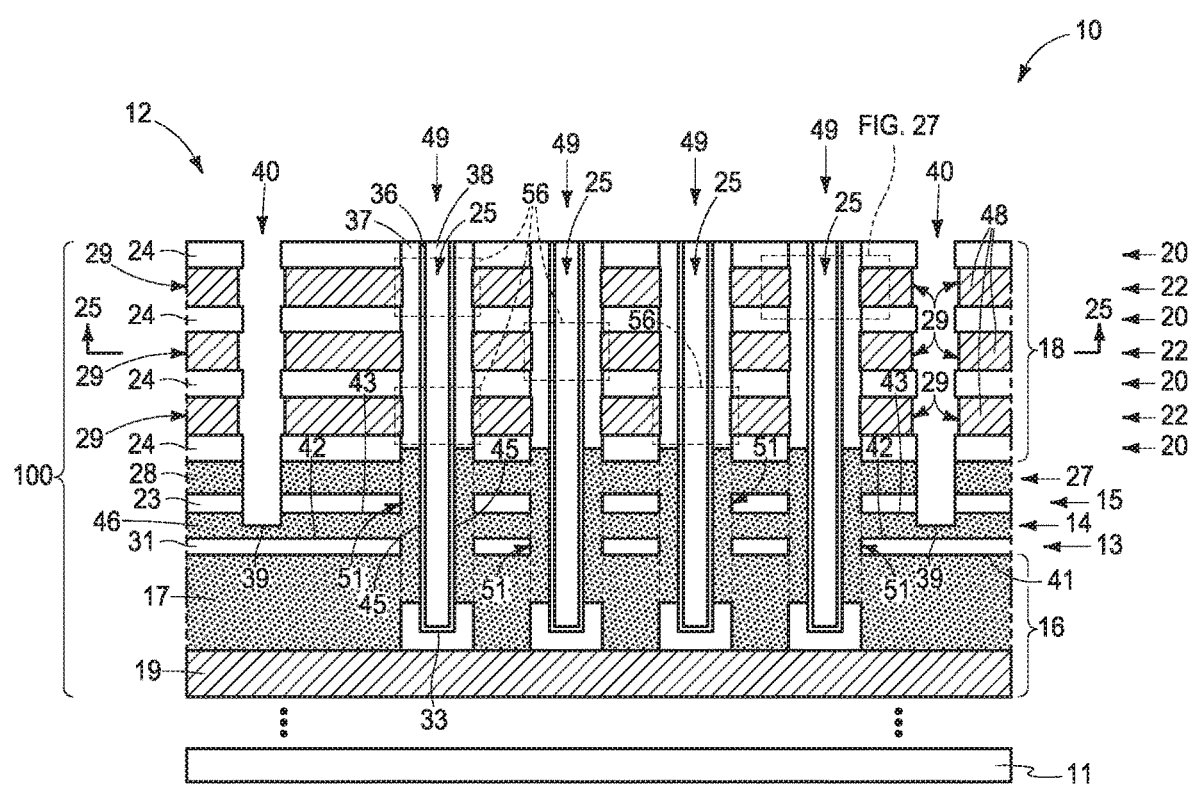
Figure 27:
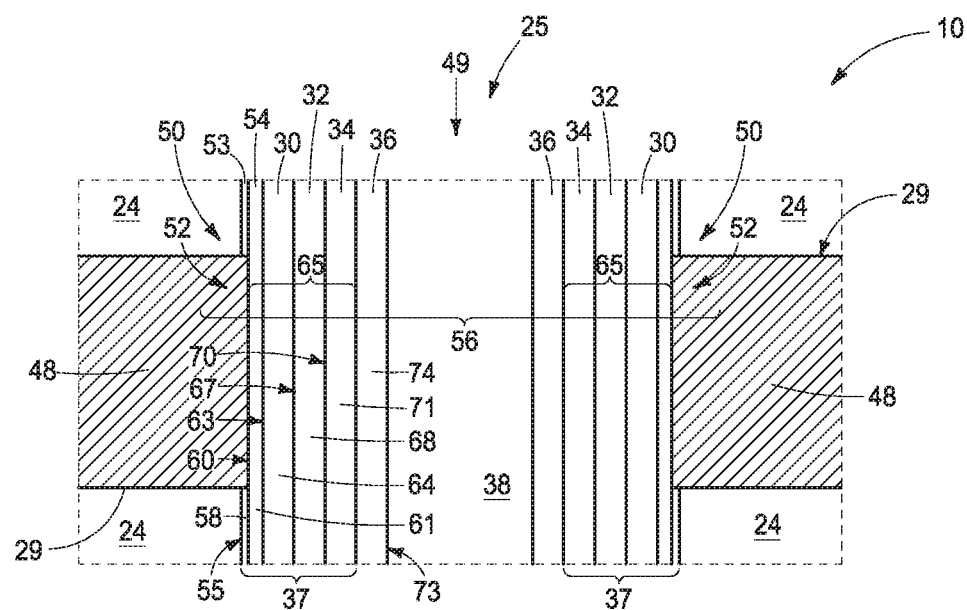

Referring to FIGS. 25-27, conductive material 48 has been removed from individual trenches 40. Such has resulted in formation of wordlines 29 and elevationally-extending strings 49 of individual transistors and/or memory cells 56. Approximate locations of transistors and/or memory cells 56 are indicated with a bracket in FIG. 27 and some with dashed outlines in FIGS. 25 and 26, with transistors and/or memory cells 56 being essentially ring-like or annular in the depicted example. Conductive material 48 may be considered as having terminal ends 50 (FIG. 27) corresponding to control-gate regions 52 of individual transistors and/or memory cells 56. Control-gate regions 52 in the depicted embodiment comprise individual portions of individual wordlines 29. Materials 54, 30, 32, and 34 may be considered as a memory structure 65 that is laterally between control-gate region 52 and channel material 36.

Charge-blocking material 54 and 30 are between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells.

Figure 28:
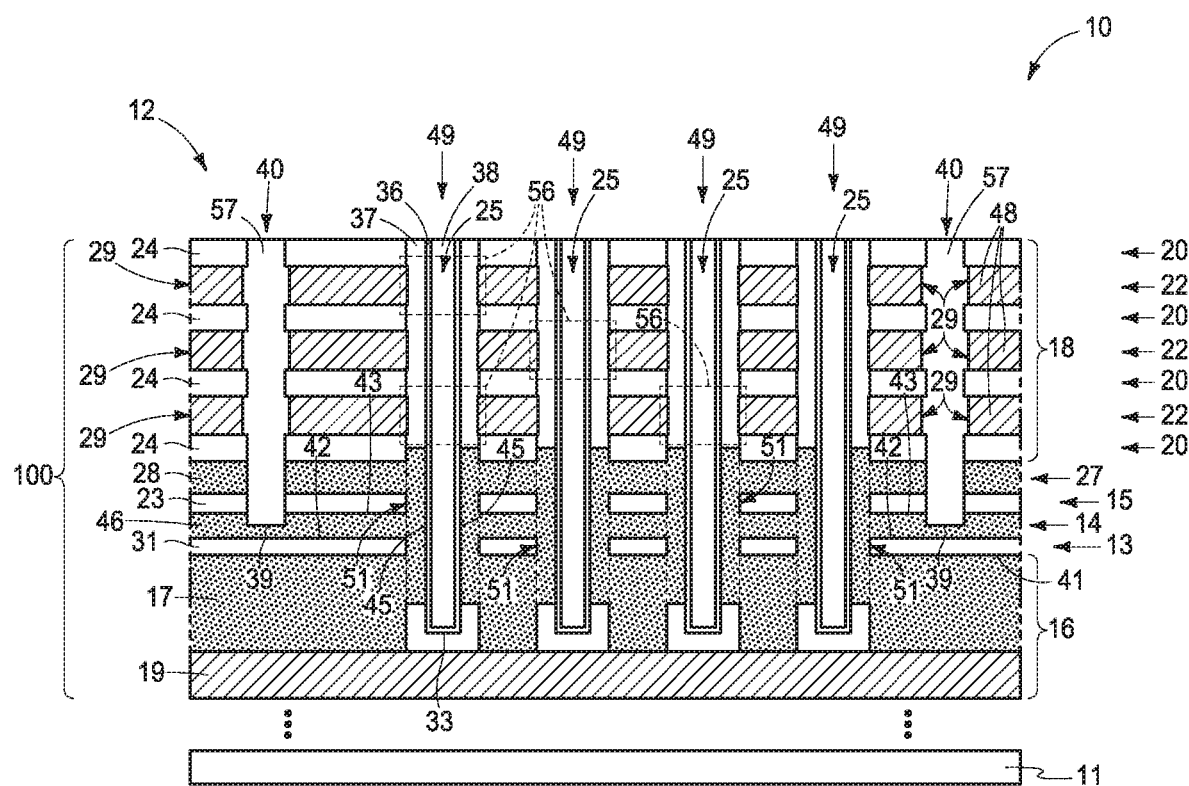

Referring to FIG. 28, a material 57 (dielectric and/or silicon-containing such as undoped polysilicon) has been formed in individual trenches 40.

In one embodiment and as described above, wordline tiers 22 comprise sacrificial material 26 (FIG. 19) and the method comprises replacing sacrificial material 26 of wordline tiers 22 with conductive wordline material 48 (FIGS. 23 and 24) after forming conductive structure 51. In one such embodiment where sacrificial sidewall liner 44 is formed in trenches 40, sacrificial sidewall liner 44 is removed after the etching of sacrificial material 21 in sacrificial material tier 14, and in one such embodiment is removed after forming conductive structure 51.

Any other attribute(s) or aspect(s) as shown and/or described herein with respect to other embodiments may be used with respect to the above-described embodiments.

The above example processing shows forming conductive material 48 of individual wordlines 29 in wordline tiers 22 after forming channel material 36. Alternately, and by way of example only, the conductive material of the individual wordlines in the wordline tiers may be formed before forming the first charge-blocking material.

An embodiment of the invention includes sequentially forming within channel openings 25 linings that extend elevationally along vertically-alternating tiers 20 and 22, with such linings individually having sidewalls that are interconnected by a bottom extending laterally there-between. Such linings comprise a first lining 60 of first charge-blocking material 54 having k of at least 7.0. A second lining (e.g., 54) of second charge-blocking material 30 having k less than 7.0 has its bottom (e.g., 66) directly above the bottom (e.g., 62) of the first lining. A third lining (e.g., 67) of storage material (e.g., 32) comprises a bottom (e.g., 69) which is directly above the bottom of the second lining. A fourth lining (e.g., 73) of insulative charge-passage material (e.g., 34) has a bottom (e.g., 72) which is directly above the bottom of the third lining. Channel material (e.g., 36) is formed within the channel openings to extend elevationally along the vertically-alternating tiers. The channel material is directly above the bottom of the fourth lining and is everywhere spaced from conductor material (e.g., 17, 19) that is in the conductive tier (e.g., 16). A conductive structure (e.g., 51) is formed that directly electrically couples the channel material to the conductor material in the conductive tier. In one such embodiment, the conductive structure is directly against a laterally-outer sidewall (e.g., 45) of the channel material in a tier (e.g., 14) that is between the conductive tier and the stack (e.g., 18). Any other attribute(s) or aspect(s) as shown and/or described herein with respect to other embodiments may be used with respect to the above-described embodiments.

Embodiments of the invention encompass memory arrays independent of method of manufacture. Nevertheless, such memory arrays may have any of the attributes as described herein in method embodiments. Likewise, the above-described method embodiments may incorporate and form any of the attributes described with respect to device embodiments.

In one embodiment, a memory array (e.g., 12) comprises strings (e.g., 49) of memory cells (e.g., 56). Such an array comprises a vertical stack (e.g., 18) comprising vertically-alternating insulative tiers (e.g., 20) and wordline tiers (e.g., 22). The wordline tiers comprise gate regions (e.g., 52) of individual memory cells. Individual of the gate regions comprise part of a wordline (e.g., 49) in individual of the wordline tiers. Channel material (e.g., 36) extends elevationally along the insulative tiers and the wordline tiers. The individual memory cells comprise a memory structure (e.g., 65) laterally between the individual gate regions and the channel material. The memory structure comprises a first charge-blocking material (e.g., 54) extending elevationally along the vertically-alternating tiers. The first charge-blocking material is directly against the individual gate regions, comprises a metal oxide, and has k of at least 7.0. A second charge-blocking material (e.g., 30) is laterally inward of the first charge-blocking material. The second charge-blocking material has k less than 7.0. Storage material (e.g., 32) is laterally inward of the second charge-blocking material. Insulative charge-passage material (e.g., 34) is laterally inward of the storage material. In one embodiment, the memory array comprises NAND. Any other attribute(s) or aspect(s) as shown and/or described herein with respect to other embodiments may be used with respect to the above-described embodiments.

In one embodiment, a memory array (e.g., 12) comprises strings (e.g., 49) of memory cells (e.g., 56). Such an array comprises a substrate (e.g., 10) comprising a conductive tier (e.g., 16). The vertical stack comprises vertically-alternating insulative tiers (e.g., 20) and wordline tiers (e.g., 22) above the conductive tier. The wordline tiers comprise gate regions (e.g., 52) of individual memory cells. Individual of the gate regions comprise part of a wordline (e.g., 29) in individual of the wordline tiers. Channel material (e.g., 36) extends elevationally along the insulative tiers and the wordline tiers and is everywhere spaced from conductor material (e.g., 17, 19) that is in the conductive tier. The individual memory cells comprise a memory structure (e.g., 65) laterally between the individual gate regions and the channel material. The memory structure comprises a first charge-blocking material (e.g., 54) extending elevationally along the vertically-alternating tiers. The first charge-blocking material is directly against the individual gate regions, comprises a metal oxide, and has k of at least 7.0. A second charge-blocking material (e.g., 30) is laterally inward of the first charge-blocking material. The second charge-blocking material has k less than 7.0. Storage material (e.g., 32) is laterally inward of the second charge-blocking material. Insulative charge-passage material (e.g., 34) is laterally inward of the storage material. A conductive structure (e.g., 51) directly electrically couples the channel material to the conductive tier. Any other attribute(s) or aspect(s) as shown and/or described herein with respect to other embodiments may be used with respect to the above-described embodiments.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, "selective" as to etch, etching, removing, removal, depositing, forming, and/or formation is such an act of one stated material relative to another stated material(s) so acted upon at a rate of at least 2:1 by volume. Further, selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprising strings of memory cells comprises forming a stack comprising vertically-alternating insulative tiers and wordline tiers. First charge-blocking material is formed to extend elevationally along the vertically-alternating tiers. The first charge-blocking material has k of at least 7.0 and comprises a metal oxide. A second charge-blocking material is formed laterally inward of the first charge-blocking material. The second charge-blocking material has k less than 7.0. Storage material is formed laterally inward of the second charge-blocking material. Insulative charge-passage material is formed laterally inward of the storage material. Channel material is formed to extend elevationally along the insulative tiers and the wordline tiers laterally inward of the insulative charge-passage material.

In some embodiments, a method used in forming a memory array comprising strings of memory cells comprises forming a stack comprising vertically-alternating insulative tiers and wordline tiers. The wordline tiers comprise sacrificial material. Channel openings are formed through the insulative tiers and wordline tiers. Insulator material is formed within the channel openings to extend elevationally along the vertically-alternating tiers. First charge-blocking material is formed within the channel openings to extend elevationally along the vertically-alternating tiers laterally inward of the insulator material. The first charge-blocking material has k of at least 7.0 and comprises a metal oxide. A second charge-blocking material is formed within the channel openings to extend elevationally along the vertically-alternating tiers laterally inward of the first charge-blocking material. The second charge-blocking material has k less than 7.0. Storage material is formed within the channel openings to extend elevationally along the vertically-alternating tiers laterally inward of the second charge-blocking material. Insulative charge-passage material is formed within the channel openings to extend elevationally along the vertically-alternating tiers laterally inward of the storage material. Channel material is formed within the channel openings to extend elevationally along the vertically-alternating tiers laterally inward of the insulative charge-passage material. After the channel material is formed, the sacrificial material is removed from the wordline tiers selectively relative to the insulator material that is in the wordline tiers. After the sacrificial material is removed, the insulator material is removed in the wordline tiers to expose a laterally outer sidewall of the first charge-blocking material. Conductive wordline material is formed in the wordline tiers directly against the exposed laterally outer sidewall of the first charge-blocking material.

In some embodiments, a method used in forming a memory array comprising strings of memory cells comprises forming a conductive tier. A stack comprising vertically-alternating insulative tiers and wordline tiers is formed above the conductive tier. Channel openings are formed through the insulative tiers and wordline tiers. Linings that extend elevationally along the vertically-alternating tiers are formed sequentially within the channel openings. The linings individually have sidewalls that are interconnected by a bottom that extends laterally there-between. The linings comprise a first lining of first charge-blocking material having k of at least 7.0 and a second lining of second charge-blocking material having k less than 7.0. The bottom of the second lining is directly above the bottom of the first lining. A third lining of storage material has a bottom which is directly above the bottom of the second lining. A fourth lining of insulative charge-passage material has a bottom which is directly above the bottom of the third lining. Channel material is formed within the channel openings to extend elevationally along the vertically-alternating tiers. The channel material is directly above the bottom of the fourth lining and is everywhere spaced from conductor material that is in the conductive tier. A conductive structure is formed that directly electrically couples the channel material to the conductor material in the conductive tier.

In some embodiments, a memory array comprising strings of memory cells comprise a vertical stack comprising vertically-alternating insulative tiers and wordline tiers. The wordline tiers comprise gate regions of individual memory cells. Individual of the gate regions comprise part of a wordline in individual of the wordline tiers. Channel material extends elevationally along the insulative tiers and the wordline tiers. The individual memory cells comprise a memory structure laterally between the individual gate regions and the channel material. The memory structure comprises a first charge-blocking material that extends elevationally along the vertically-alternating tiers. The first charge-blocking material is directly against the individual gate regions and comprises a metal oxide having k of at least 7.0. A second charge-blocking material is laterally inward of the first charge-blocking material. The second charge-blocking material has k less than 7.0. Storage material is laterally inward of the second charge-blocking material. Insulative charge-passage material is laterally inward of the storage material.

In some embodiments, a memory array comprising strings of memory cells comprises a substrate comprising a conductive tier. A vertical stack comprises vertically-alternating insulative tiers and wordline tiers is above the conductive tier. The wordline tiers comprise gate regions of individual memory cells. Individual of the gate regions comprise part of a wordline in individual of the wordline tiers. Channel material extends elevationally along the insulative tiers and the wordline tiers and is everywhere spaced from conductor material that is in the conductive tier. The individual memory cells comprise a memory structure laterally between the individual gate regions and the channel material. The memory structure comprises a first charge-blocking material extending elevationally along the vertically-alternating tiers. The first charge-blocking material is directly against the individual gate regions and comprise a metal oxide having k of at least 7.0. A second charge-blocking material is laterally inward of the first charge-blocking material. The second charge-blocking material has k less than 7.0. Storage material is laterally inward of the second charge-blocking material. Insulative charge-passage material is laterally inward of the storage material. A conductive structure directly electrically couples the channel material to the conductive tier.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array comprising strings of memory cells, comprising:
   forming a stack comprising vertically-alternating insulative tiers and wordline tiers;
   forming first charge-blocking material to extend elevationally along the vertically-alternating tiers, the first charge-blocking material having k of at least 7.0 and comprising a metal oxide;
   forming a second charge-blocking material laterally inward of the first charge-blocking material, the second charge-blocking material having k less than 7.0;
   forming storage material laterally inward of the second charge-blocking material;
   forming insulative charge-passage material laterally inward of the storage material;
   forming channel material to extend elevationally along the insulative tiers and the wordline tiers laterally inward of the insulative charge-passage material; and
   forming conductive material of individual wordlines in the wordline tiers after forming the channel material.

2. A method used in forming a memory array comprising strings of memory cells, comprising:
   forming a stack comprising vertically-alternating insulative tiers and wordline tiers;
   forming first charge-blocking material to extend elevationally along the vertically-alternating tiers, the first charge-blocking material having k of at least 7.0 and comprising a metal oxide;
   forming a second charge-blocking material laterally inward of the first charge-blocking material, the second charge-blocking material having k less than 7.0;
   forming storage material laterally inward of the second charge-blocking material;
   forming insulative charge-passage material laterally inward of the storage material;
   forming channel material to extend elevationally along the insulative tiers and the wordline tiers laterally inward of the insulative charge-passage material;
   forming conductive material of individual wordlines in the wordline tiers after forming the channel material;
   forming insulator material to extend elevationally along the vertically-alternating tiers prior to forming the first charge-blocking material; and
   removing the insulator material within the wordline tiers to expose a laterally outer sidewall of the first charge-blocking material prior to forming the conductive material, the conductive material being formed in the wordline tiers directly against the exposed laterally outer sidewalls of the first charge-blocking material.

3. The method of claim 2 comprising forming the insulator material by atomic layer deposition and to be directly against insulating material of the insulative tiers.

4. The method of claim 3 wherein the insulating material and the insulator material are of the same composition relative one another.

5. The method of claim 2 comprising forming each of the second charge-blocking material, the storage material, and the insulative charge-passage material to extend elevationally along the vertically-alternating tiers.

6. The method of claim 1 claim 3 forming CMOS under array circuitry.

7. The method of claim 2 wherein the first charge-blocking material comprises an insulative metal oxide comprising at least one of Ti, La, Sc, Ta, and Dy.

8. The method of claim 2 wherein the first charge-blocking material has k of at least 8.0 and the second charge-blocking material has k of no more than 5.0.

9. The method of claim 8 wherein the first charge-blocking material has k of at least 9.0 and the second charge-blocking material has k of no more than 4.0.

10. The method of claim 2 wherein the first charge-blocking material comprises an insulative metal oxide comprising at least one of Al, Hf, Zr, Ti, La, Sc, Ta, and Dy.

11. The method of claim 10 wherein the first charge-blocking material comprises at least one of an aluminate and a silicate.

12. The method of claim 10 wherein the insulative metal oxide comprises multiple elemental metals.

13. The method of claim 10 wherein the insulative metal oxide comprises $Al_2O_3$.

14. The method of claim 2 wherein the second charge-blocking material comprises $SiO_2$.

15. A method used in forming a memory array comprising strings of memory cells, comprising:
   forming a stack comprising vertically-alternating insulative tiers and wordline tiers;
   forming first charge-blocking material to extend elevationally along the vertically-alternating tiers, the first charge-blocking material having k of at least 7.0 and comprising a metal oxide;

forming a second charge-blocking material laterally inward of the first charge-blocking material, the second charge-blocking material having k less than 7.0;

forming storage material laterally inward of the second charge-blocking material;

forming insulative charge-passage material laterally inward of the storage material;

forming channel material to extend elevationally along the insulative tiers and the wordline tiers laterally inward of the insulative charge-passage material; and forming conductive material of individual wordlines in the wordline tiers before forming the first charge-blocking material.

16. A method used in forming a memory array comprising strings of memory cells, comprising:

forming a stack comprising vertically-alternating insulative tiers and wordline tiers, the wordline tiers comprising sacrificial material;

forming channel openings through the insulative tiers and wordline tiers;

forming insulator material within the channel openings to extend elevationally along the vertically-alternating tiers;

forming first charge-blocking material within the channel openings to extend elevationally along the vertically-alternating tiers laterally inward of the insulator material, the first charge-blocking material having k of at least 7.0 and comprising a metal oxide;

forming a second charge-blocking material within the channel openings to extend elevationally along the vertically-alternating tiers laterally inward of the first charge-blocking material, the second charge-blocking material having k less than 7.0;

forming storage material within the channel openings to extend elevationally along the vertically-alternating tiers laterally inward of the second charge-blocking material;

forming insulative charge-passage material within the channel openings to extend elevationally along the vertically-alternating tiers laterally inward of the storage material;

forming channel material within the channel openings to extend elevationally along the vertically-alternating tiers laterally inward of the insulative charge-passage material;

after forming the channel material, removing the sacrificial material from the wordline tiers selectively relative to the insulator material that is in the wordline tiers;

after removing the sacrificial material, removing the insulator material in the wordline tiers to expose a laterally outer sidewall of the first charge-blocking material; and forming conductive wordline material in the wordline tiers directly against the exposed laterally outer sidewall of the first charge-blocking material.

17. The method of claim 16 wherein the first charge-blocking material comprises $Al_2O_3$ and the second charge-blocking material comprises $SiO_2$.

18. The method of claim 17 wherein the insulator material comprises $SiO_2$.

19. The method of claim 16 wherein the sacrificial material comprises $Si_3N_4$ and the insulator material comprises $SiO_2$, the removing of the sacrificial material comprising etching with $H_3PO_4$, the removing of the insulator material comprising etching with HF.

20. A method used in forming a memory array comprising strings of memory cells, comprising:

forming a conductive tier;

forming a stack comprising vertically-alternating insulative tiers and wordline tiers above the conductive tier;

forming channel openings through the insulative tiers and wordline tiers;

sequentially forming within the channel openings linings that extend elevationally along the vertically-alternating tiers, the linings individually having sidewalls that are interconnected by a bottom extending laterally there-between, the linings comprising:

a first lining of first charge-blocking material having k of at least 7.0;

a second lining of second charge-blocking material having k less than 7.0, the bottom of the second lining being directly above the bottom of the first lining;

a third lining of storage material the bottom of which is directly above the bottom of the second lining; and a fourth lining of insulative charge-passage material the bottom of which is directly above the bottom of the third lining;

forming channel material within the channel openings to extend elevationally along the vertically-alternating tiers, the channel material being directly above the bottom of the fourth lining and everywhere spaced from conductor material that is in the conductive tier; and forming a conductive structure that directly electrically couples the channel material to the conductor material in the conductive tier.

21. The method of claim 20 comprising forming an insulator material lining in the channel openings that extends elevationally along the vertically-alternating tiers prior to forming the first lining, the insulator material lining having sidewalls that are interconnected by a bottom extending laterally there-between, the bottom of the first lining being directly above the bottom of the insulator material lining.

22. The method of claim 20 wherein the channel material is formed to comprise a lining having sidewalls that are interconnected by a bottom extending laterally there-between, the bottom of the channel material being directly above the bottom of the fourth lining.

23. The method of claim 20 comprising forming the conductive structure directly against a laterally-outer sidewall of the channel material in a tier that is between the conductive tier and the stack.

* * * * *